(12) United States Patent
Motwani et al.

(10) Patent No.: US 11,086,714 B2
(45) Date of Patent: Aug. 10, 2021

(54) PERMUTATION OF BIT LOCATIONS TO REDUCE RECURRENCE OF BIT ERROR PATTERNS IN A MEMORY DEVICE

(71) Applicant: Intel Corporation, Santa Clara, CA (US)

(72) Inventors: Ravi H. Motwani, Fremont, CA (US); Zion S. Kwok, Vancouver (CA)

(73) Assignee: Intel Corporation, Santa Clara, CA (US)

( * ) Notice: Subject to any disclaimer, the term of this patent is extended or adjusted under 35 U.S.C. 154(b) by 7 days.

(21) Appl. No.: 16/578,039

(22) Filed: Sep. 20, 2019

(65) Prior Publication Data
US 2020/0012554 A1 Jan. 9, 2020

(51) Int. Cl.
*G06F 11/00* (2006.01)
*G06F 11/10* (2006.01)
*G06F 7/58* (2006.01)
*G06F 7/76* (2006.01)
*H03M 13/11* (2006.01)

(52) U.S. Cl.
CPC ............ *G06F 11/102* (2013.01); *G06F 7/582* (2013.01); *G06F 7/76* (2013.01); *G06F 11/1044* (2013.01); *H03M 13/1105* (2013.01)

(58) Field of Classification Search
None
See application file for complete search history.

(56) References Cited

U.S. PATENT DOCUMENTS

| | | | |
|---|---|---|---|
| 2005/0066110 A1* | 3/2005 | Raz | G06F 11/1008 711/103 |
| 2006/0153313 A1* | 7/2006 | Lee | H04L 25/03866 375/285 |
| 2011/0010603 A1* | 1/2011 | Yang | H03M 13/333 714/755 |
| 2012/0113984 A1* | 5/2012 | Gunnam | H04L 49/1507 370/388 |
| 2013/0101111 A1* | 4/2013 | Sharon | G11B 20/0021 380/28 |
| 2014/0122973 A1 | 5/2014 | Motwani | |

(Continued)

OTHER PUBLICATIONS

Y. Han and W. E. Ryan, "Concatenating a Structured LDPC Code and a Constrained Code to Preserve Soft-Decoding, Structure, and Burst Correction," in IEEE Transactions on Magnetics, vol. 42, No. 10, pp. 2558-2560, Oct. 2006, doi: 10.1109/TMAG.2006.880465. (Year: 2006).*

*Primary Examiner* — Daniel F. McMahon
(74) *Attorney, Agent, or Firm* — Schwabe, Williamson & Wyatt, P.C.

(57) ABSTRACT

Embodiments described include methods, apparatuses, and systems including a permutation generator to permute locations of one or more bits (e.g., data bits and/or parity bits) in a codeword. In embodiments, the bits are to be written to a memory device based on the permuted locations to reduce a recurrence of bit error patterns associated with the bits when stored in the memory device. In some embodiments, the locations are based at least in part on a pseudorandom number, generated based at least in part on information available at a read time and a write time. In some embodiments, the pseudorandom number is based upon a memory address of the memory device, such as a 3D NAND or other memory device.

19 Claims, 9 Drawing Sheets

(56) References Cited

U.S. PATENT DOCUMENTS

2015/0082425 A1* 3/2015 Johnson .................... H04L 9/14
 726/22
2017/0149456 A1* 5/2017 Jeon ...................... H04L 1/0058

* cited by examiner

PERMUTATION OF BIT LOCATIONS TO REDUCE RECURRENCE OF BIT ERROR PATTERNS IN A MEMORY DEVICE

FIELD

Embodiments of the present disclosure generally relate to the field of integrated circuits (IC), and more particularly, to error correction and data recovery techniques for solid-state memory devices

BACKGROUND

In memory devices, recurrent bit error patterns may be associated with storage of a significant number of erroneous codewords, e.g., up to 10 million faulty codewords in 3D NAND die. In order to address the problem, redundant bit line structures, e.g., pillars, are often created in the memory devices. The pillars, however, often consume valuable die space while still failing to sufficiently address issues associated with miscorrection, uncorrectable errors, or silent data errors. Error correction codes (ECCs) are also used to mitigate errors and are used by a memory controller of the device to detect and correct errors after each read operation. For example, an ECC may pad the original data or user-information bits with a controlled amount of redundant bits (e.g., parity bits or other ECC information) to form the codeword. The codeword is written/stored on the memory device and is retrieved and then returned to the memory controller after the read operation. The memory controller then uses a decoder to recover the correct codeword and correct the data or user-information bits. The ECC encoder/decoder may use various types of ECC codes. For example, low-density parity-check (LDPC) codes are often used due to their high correction capabilities and reasonable hardware implementations. LDPC codes, however, more than some types of algebraic codes, may be associated with uncorrectable or silent errors.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example and not by way of limitation in the figures of the accompanying drawings.

DETAILED DESCRIPTION

Embodiments described include methods, apparatuses, and systems including a permutation generator to permute locations of one or more bits (e.g., data bits or parity bits) in a codeword. In embodiments, the bits are to be written to a memory device according to the permuted locations to reduce a recurrence of bit error patterns associated with the bits when stored in the memory device. In some embodiments, the permuted locations are based at least in part on a pseudorandom number, generated based at least in part on a memory address of the memory device, such as a 3D NAND or cross-point array memory device. In embodiments, the permutation generator is to randomize the data bit or parity bit locations (also, "bit locations") by changing a location of the bits. In embodiments, changing the location includes rotating bit locations or swapping bit locations without changing a value of the rotated or swapped bits. In some embodiments, the permutation generator includes, e.g., an omega network or other permutation matrix. In embodiments, the codeword includes a codeword generated by the memory controller and includes encoded data and error correction code (ECC) information.

In the following description, various aspects of the illustrative implementations will be described using terms commonly employed by those skilled in the art to convey the substance of their work to others skilled in the art. However, it will be apparent to those skilled in the art that embodiments of the present disclosure may be practiced with only some of the described aspects. For purposes of explanation, specific numbers, materials and configurations are set forth in order to provide a thorough understanding of the illustrative implementations. However, it will be apparent to one skilled in the art that embodiments of the present disclosure may be practiced without the specific details. In other instances, well-known features are omitted or simplified in order not to obscure the illustrative implementations.

In the following detailed description, reference is made to the accompanying drawings that form a part hereof, wherein like numerals designate like parts throughout, and in which is shown by way of illustration embodiments in which the subject matter of the present disclosure may be practiced. It is to be understood that other embodiments may be utilized and structural or logical changes may be made without departing from the scope of the present disclosure. Therefore, the following detailed description is not to be taken in a limiting sense, and the scope of embodiments is defined by the appended claims and their equivalents.

For the purposes of the present disclosure, the phrase "A and/or B" means (A), (B), (A) or (B), or (A and B). For the purposes of the present disclosure, the phrase "A, B, and/or C" means (A), (B), (C), (A and B), (A and C), (B and C), or (A, B and C).

The description may use perspective-based descriptions such as top/bottom, in/out, over/under, and the like. Such descriptions are merely used to facilitate the discussion and are not intended to restrict the application of embodiments described herein to any particular orientation.

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

The term "coupled with," along with its derivatives, may be used herein. "Coupled" may mean one or more of the following. "Coupled" may mean that two or more elements are in direct physical or electrical contact. However, "coupled" may also mean that two or more elements indirectly contact each other, but yet still cooperate or interact with each other, and may mean that one or more other elements are coupled or connected between the elements that are said to be coupled with each other. The term "directly coupled" may mean that two or more elements are in direct contact.

Figure 1:
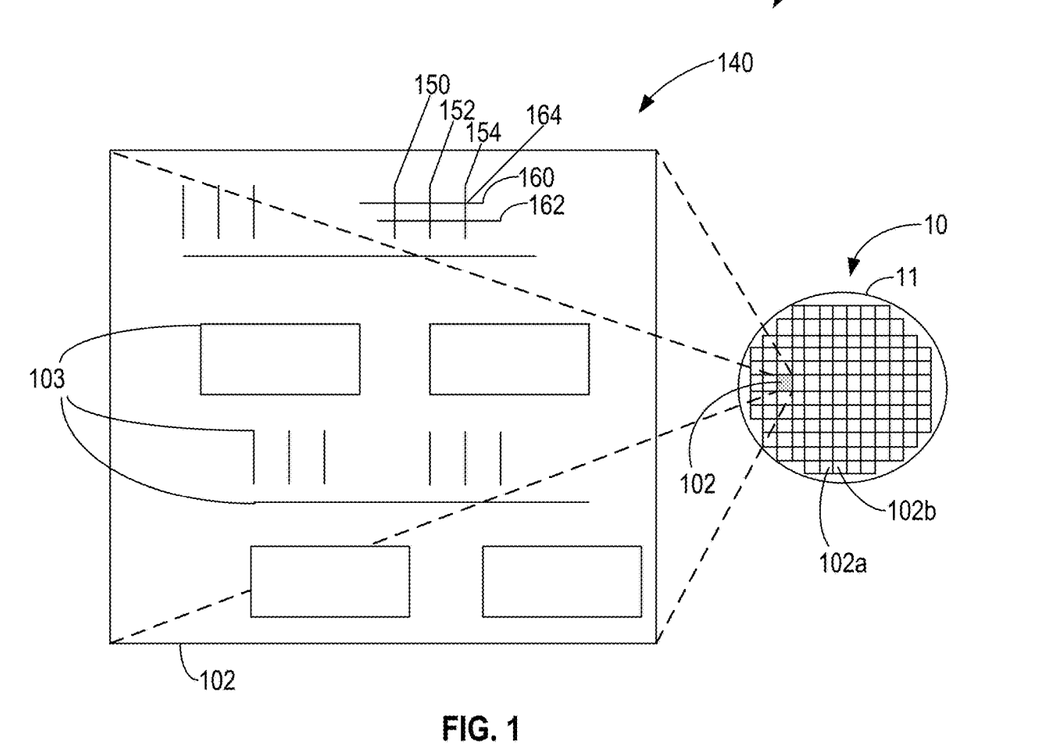
FIG. 1 illustrates an example die in which a memory device may be provided, in accordance with embodiments of the present disclosure.

FIG. 1 illustrates an example die that stores bits according to permuted locations to reduce a recurrence of bit error patterns associated with the bits when stored in the die, according to techniques of the present disclosure, in accordance with some embodiments. More specifically, FIG. 1 schematically illustrates an integrated circuit assembly (IC) assembly 100 including a top view of die 102 in wafer form 10 and in singulated form 140, in accordance with some embodiments. In some embodiments, the die 102 may be one of a plurality of dies (e.g., die 102, 102*a*, 102*b*) of a wafer 11 composed of semiconductor material such as, for example, silicon or other suitable material. The plurality of dies may be formed on a surface of the wafer 11. Each of the dies may be a repeating unit of a semiconductor product that may form a memory device. For example, die 102 may include circuitry 103 and/or another memory device module or component as described herein in accordance with some embodiments. According to various embodiments, the circuitry 103 may include one or more memory elements (memory cells, such as, e.g., multi-level per cell memory cells), which may be configured in an array, such as a two-dimensional (2D) or three-dimensional (3D) non-volatile multi-level cell (MLC) memory array. In some embodiments, the memory array may comprise a 2D or 3D multi-level per cell such as three-level-per-cell (TLC) or four-level-per-cell (QLC) NAND memory array. In some embodiments, the memory array comprises a cross-point memory array.

The circuitry 103 may further include one or more wordline(s) (also referred to as "WL" or "WLs") (e.g., 150, 152, 154) and one or more bitline(s) (also referred to as "BL" or "BLs") (e.g., 160, 162) coupled to the memory elements. Only three wordlines and two bitlines are shown in FIG. 1 for ease of understanding. In some embodiments, the bitlines and wordlines may be configured such that each of the memory elements may be disposed at an intersection (e.g., 164) of each individual bitline and wordline (e.g., 160 and 154), in a cross-point configuration. A voltage or bias can be applied to a target memory element of the memory elements using the wordlines and the bitlines to select the target memory cell for a read or write operation. Bitline drivers may be coupled to the bitlines and wordline drivers may be coupled to the wordlines to facilitate decoding/selection of the memory elements. To enable memory cell selection, the wordlines 150, 152, 154 may be connected with memory cells and other parts of circuitry 103 via interconnects, including respective contact structures (e.g., vias) that provide electrical connectivity through the layers of the die 102 as described below in greater detail. It is noted that the circuitry 103 is only schematically depicted in FIG. 1 and may represent a wide variety of suitable logic or memory in the form of circuitry or other suitable devices and configurations including, for example, one or more state machines including circuitry and/or instructions in storage (e.g., firmware or software) configured to perform actions related to bit location permutations as described herein.

In some embodiments, circuitry 103 may be formed using suitable semiconductor fabrication techniques, some of which are described herein. After a fabrication process of the semiconductor product is complete, the wafer 11 may undergo a singulation process in which each of the dies (e.g., die 102) may be separated from one another to provide discrete "chips" of the semiconductor product. The wafer 11 may be any of a variety of sizes. According to various embodiments, the circuitry 103 may be disposed on a semiconductor substrate in wafer form 10 or singulated form 140. In embodiments, the die 102 may include bit locations associated with a plurality of addresses, e.g., physical or logical addresses. In accordance with embodiments described further below, bits (e.g., data bits and/or parity bits) may be written to the die in permuted bit locations to reduce a recurrence of bit error patterns across the die. In embodiments, the permuted bit locations are based at least in part upon a pseudorandom number.

Figure 2:
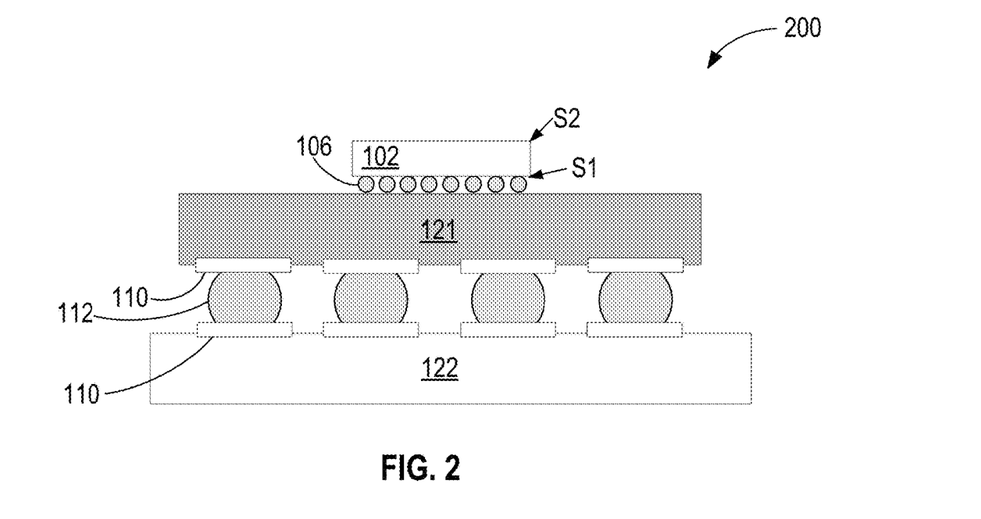
FIG. 2 schematically illustrates a cross-section side view of an integrated circuit (IC) assembly that may include a memory device, in accordance with embodiments of the present disclosure.

FIG. 2 schematically illustrates a cross-section side view of an example integrated circuit (IC) assembly 200 that may include a memory device, provided in accordance with some embodiments described herein. In some embodiments, the IC assembly 200 may include one or more dies electrically and/or physically coupled with a package substrate 121. The die 102 may include circuitry (e.g., circuitry 103 of FIG. 1) and/or other suitable components or modules to perform operations in connection with permutation of a location of bits as described herein. In some embodiments, the package substrate 121 is coupled with a circuit board 122, as shown.

The IC assembly 200 may include a wide variety of configurations including, for example, suitable combinations of flip-chip and/or wire-bonding configurations, interposers, multi-chip package configurations including System in Package (SiP) and/or Package on Package (PoP) configurations. For example, the die 102 can be attached to the package substrate 121 according to a wide variety of suitable configurations including, for example, being directly coupled with the package substrate 121 in a flip-chip configuration, as depicted. In the flip-chip configuration, an active side, S1, of the die 102 including active circuitry is attached to a surface of the package substrate 121 using die-level interconnect structures 106 such as bumps, pillars, or other suitable structures that may also electrically couple the die 102 with the package substrate 121. The active side S1 of the die 102 may include circuitry such as, for example, memory elements as described in reference to FIG. 1. An inactive side, S2, may be disposed opposite to the active side S1, as can be seen. In other embodiments, the die 102 may be disposed on another die that is coupled with the package substrate 121 in any of a variety of suitable stacked die configurations. For example, a processor die may be coupled with the package substrate 121 in a flip-chip configuration and the die 102 may be mounted on the processor die in a flip-chip configuration and electrically coupled with the package substrate 121 using through-silicon vias (TSVs) formed through the processor die. In still other embodiments, the die 102 may be embedded in the package substrate 121 or coupled with a die that is embedded in the package substrate 121. Other dies may be coupled with the package substrate 121 in a side-by-side configuration with the die 102 in other embodiments.

In some embodiments, the die-level interconnect structures 106 may be configured to route electrical signals between the die 102 and the package substrate 121. The electrical signals may include, for example, input/output (I/O) signals and/or power/ground signals that are used in connection with operation of the die. The die-level interconnect structures 106 may be coupled with corresponding die contacts disposed on the active side S1 of the die 102 and corresponding package contacts disposed on the package substrate 121. The die contacts and/or package contacts may include, for example, pads, vias, trenches, traces and/or other suitable contact structures, fabrication of some of which is described below.

In some embodiments, the package substrate 121 may comprise an epoxy-based laminate substrate having a core and/or build-up layers such as, for example, an Ajinomoto Build-up Film (ABF) substrate. The package substrate 121 may include other suitable types of substrates in other embodiments including, for example, substrates formed from glass, ceramic, or semiconductor materials.

The package substrate 121 may include electrical routing features configured to route electrical signals to or from the die 102. The electrical routing features may include, for example, package contacts (e.g., pads 110) disposed on one or more surfaces of the package substrate 121 and/or internal routing features (not shown) such as, for example, trenches, vias or other interconnect structures to route electrical signals through the package substrate 121.

In some embodiments, the package substrate 121 may be coupled with a circuit board 122, as can be seen. The circuit board 122 may be a printed circuit board (PCB) composed of an electrically insulative material such as an epoxy laminate. For example, the circuit board 122 may include electrically insulating layers composed of materials that may be laminated together. Interconnect structures (not shown) such as traces, trenches, or vias may be formed through the electrically insulating layers to route the electrical signals of the die 102 through the circuit board 122. The circuit board 122 may be composed of other suitable materials in other embodiments. In some embodiments, the circuit board 122 may be a motherboard and may be included in a computing device, such as, for example, a mobile device. Package-level interconnects such as, for example, solder balls 112 may be coupled to pads 110 on the package substrate 121 and/or on the circuit board 122 to form corresponding solder joints that may be configured to further route the electrical signals between the package substrate 121 and the circuit board 122. The pads 110 may be composed of any suitable electrically conductive material such as metal. The package-level interconnect may include other structures and/or configurations including, for example, land-grid array (LGA) structures and the like. In embodiments, the die 102 of the IC assembly 200 may be, include, or be a part of an IC including or included in a memory device, such as, e.g., a memory device that is to store a codeword having permuted locations of one or more bits in the codeword based at least in part on a seed such as a pseudorandom number, as will be described in connection with FIGS. 3-8.

Figure 3A:
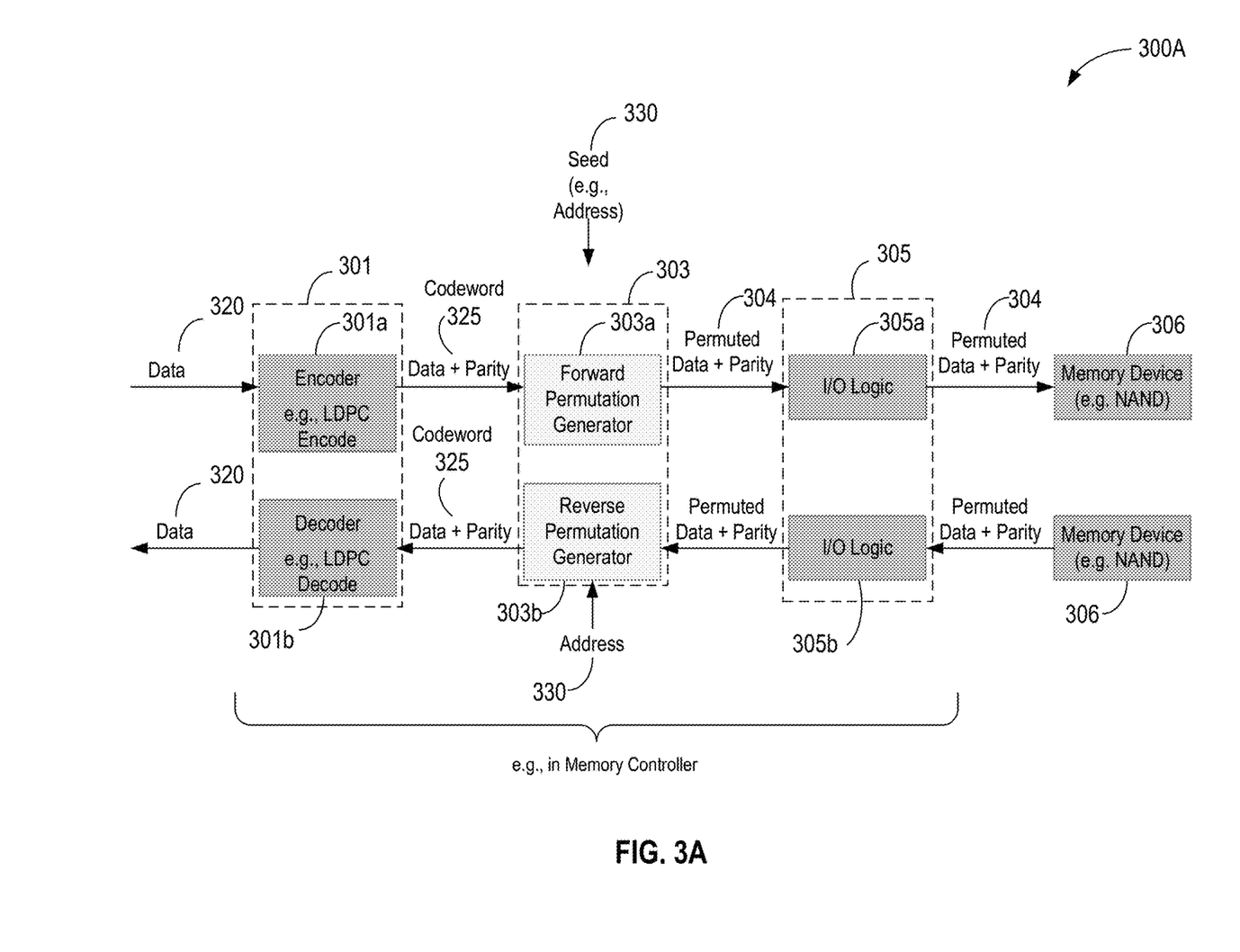
FIG. 3A is an example block diagram of an environment associated with permuting locations of bits, in accordance with embodiments of the present disclosure.

FIG. 3A is an example block 300A of an environment 300A associated with permuting locations of bits (e.g., data bits and/or parity bits), in accordance with embodiments of the present disclosure. Environment 300 is associated with permuting locations (e.g., changing locations) of bits to be written to a memory device to reduce a recurrence of bit error patterns associated with the data stored in the memory device. As discussed further in connection with FIGS. 4-6, in embodiments, the locations of the bits are changed or permuted based at least in part on a pseudorandom number. In various embodiments, the pseudorandom number is seeded with an address 330, e.g., address 330 that may include a memory address. Environment 300 includes an encoder/decoder 301 that includes an encoder 301a and a decoder 301b, a permutation generator 303 that includes a forward permutation generator 303a and a reverse permutation generator 303b, input/output (I/O) logic 305 that includes I/O logic 305a and 305b, and a memory device 306, according to embodiments.

Accordingly, beginning on a left side of FIG. 3A, as shown, encoder 301a is coupled to receive bits, e.g., data 320. In embodiments, encoder 301a is to encode the bits into a codeword 325 that includes data bits and parity bits. In embodiments, permutation generator 303, e.g., forward permutation generator 303a, is coupled to encoder 301a to receive codeword 325. In embodiments, forward permutation generator 303a is to permute a location of one or more bits in codeword 325 to generate permuted data and/or permuted parity bits 304. Accordingly, in some embodiments only locations data bits are permuted and in other embodiments, locations of both data bits and parity bits are permuted. In embodiments, locations of the bits are changed or permuted based at least in part on a pseudorandom number seeded with an address, e.g., address 330. In embodiments, as discussed further with respect to FIG. 4, address 330 corresponds to a memory device address associated with a physical or logical address associated with the codeword at the beginning of processing the codeword. Note that, for example, in some embodiments, permutation generator 303 includes a software implementation. In other embodiments, permutation generator 303 includes a hardware implementation. In embodiments, permutation generator 303 includes a networked plurality of switches (shown and discussed in more detail with respect to FIGS. 4 and 5) and provides the bits having the permuted locations to an I/O logic of memory device 306, e.g., I/O logic 305a. In embodiments, I/O logic 305a then provides permuted data and parity bits 304 for storage to memory device 306 to be stored in locations corresponding to the permuted data bit locations.

In embodiments, moving leftward from memory device 306 in the lower row of FIG. 3A, I/O logic 305b retrieves permuted data and parity bits 304 from memory device 306. The permuted data and parity bits 304 are retrieved in response to a read request of data 320 and provided by I/O logic 305b to reverse permutation generator 303b to reverse permute locations of the retrieved bits to recover codeword 325 based on the pseudorandom number. In embodiments, codeword 325 is then provided to a decoder 301b e.g., an LDPC decoder, to decode codeword 325 to recover data 320.

In embodiments, memory device 306 includes 3D NAND memory or other suitable memory device that may benefit from reduction of a recurrence of bit error patterns in the stored data. As noted previously, recurrent bit error patterns may be associated with a failure of up to 10 million codewords in, e.g., 3D NAND memory devices. Redundant pillars (e.g., bit line structures) created in 3D NAND memory devices to address bit error patterns may consume valuable die space while still failing to sufficiently address issues associated with miscorrection, uncorrectable errors, or silent data errors. In various embodiments, memory device 306 includes any suitable memory device that includes shared bit lines.

Further note that environment 300A may include more or fewer elements (or the elements may be combined) than as shown in FIG. 3A. For example, in some embodiments, the permutations can take place within encoder/decoder 301. In embodiments, storing the bits or bits according to their permuted locations can reduce a recurrence of bit error patterns associated with the bits when stored in the memory device.

Figure 3B:
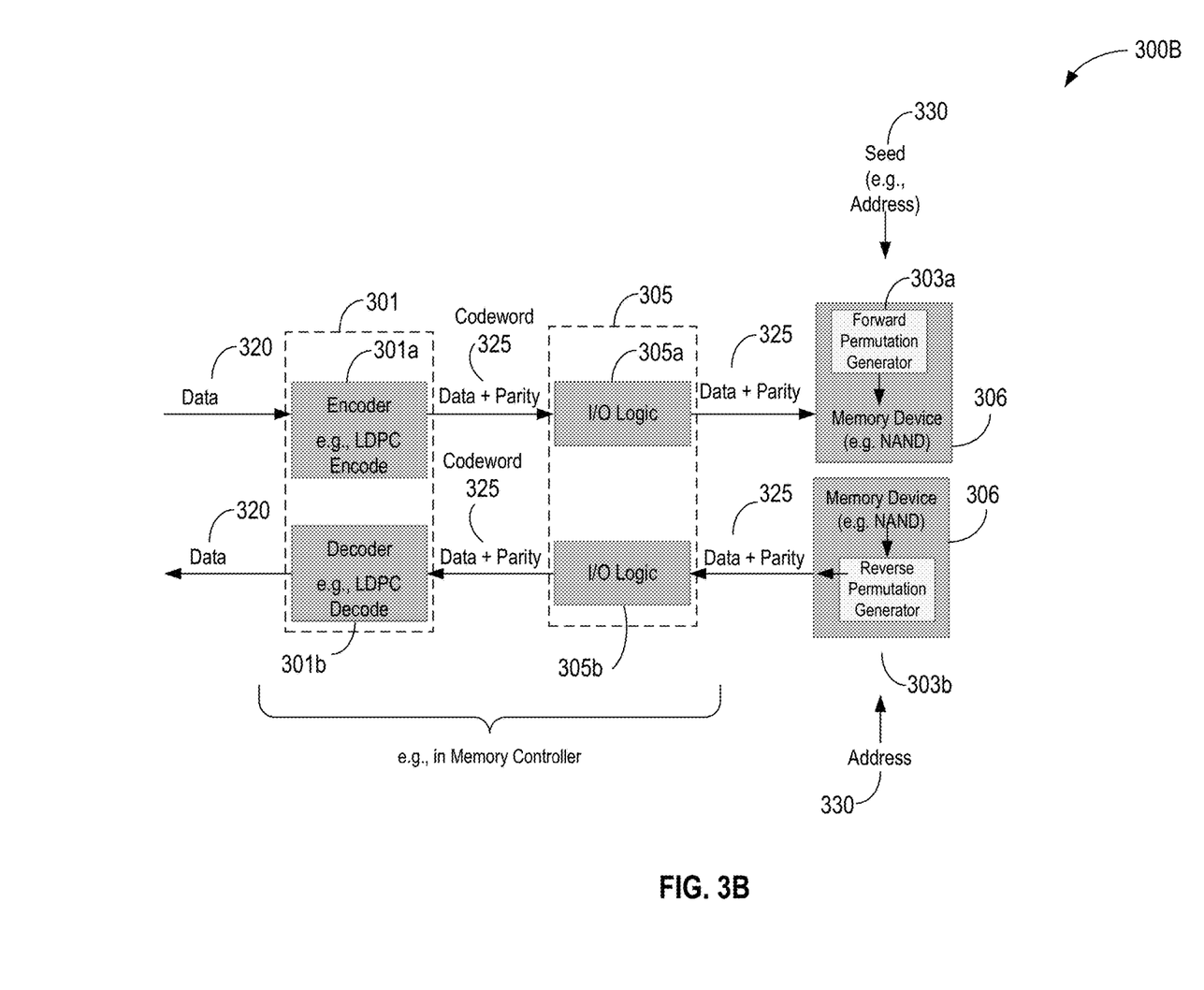
FIG. 3B is an example block diagram of an additional environment associated with permuting locations of bits, in accordance with embodiments of the present disclosure.

As an additional example, FIG. 3B illustrates an environment 300B where permutations can take place within memory device 306 itself. Note that FIG. 3B has similarly numbered elements as FIG. 3A, except that in FIG. 3B, e.g., memory device 306 includes forward permutation generator 303a and reverse permutation generator 303b. In embodiments, memory device 306 includes, e.g., a NAND die, and forward permutation generator 303a provides bits with permuted locations to memory cells of the die and reverse permutation generator 303b performs a reverse permutation on retrieved bits. In embodiments, the permutation generator may include an interface to receive bits to be written to memory device from the ECC engine (which may be located in the memory controller). Note that in embodiments, the permutation generator includes an interface to receive the bits to be written to the memory device whether the permutation generator is located in the memory controller or the memory device itself.

Accordingly, in embodiments, the permutation generator includes an interface to receive bits to be written to a memory device from an error correction code (ECC) engine, wherein the ECC engine to include an encoder to receive and to encode the bits into a codeword. In embodiments, the permutation generator includes the interface and is coupled to the ECC engine to receive the codeword and to permute a location of one or more bits in the codeword based at least in part on a pseudorandom number and to provide the bits to be written to the memory device based on the permuted locations to reduce a recurrence of bit error patterns associated with the a bits when stored in the memory device.

Figure 4:
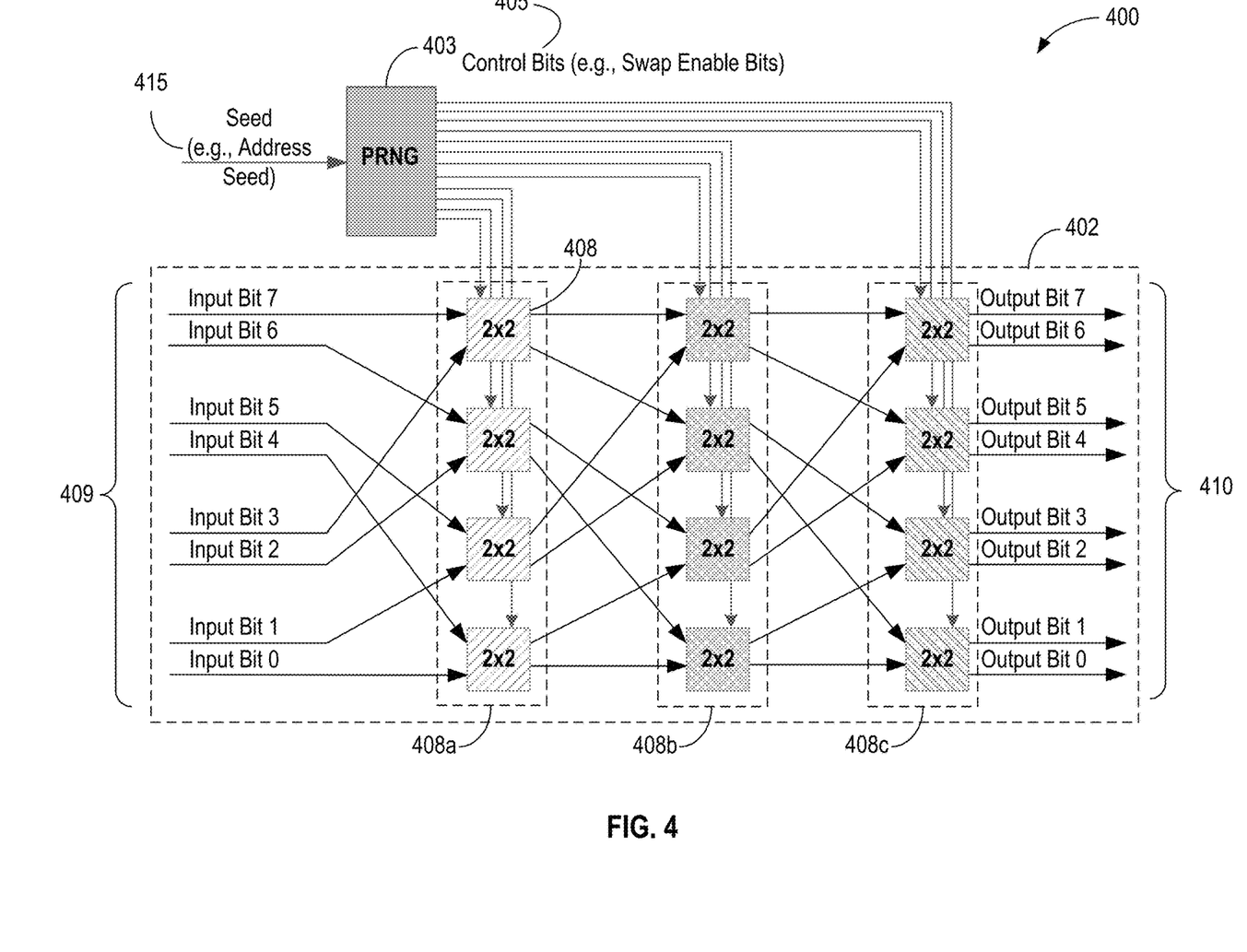
FIG. 4 illustrates an example permutation generator that may be similar or the same as included in the environment of FIGS. 3A-3B, according to embodiments of the present disclosure.

FIG. 4 illustrates an example permutation generator that may be similar or the same as permutation generator 303 of FIG. 3A or FIG. 3B, according to embodiments. In FIG. 4, permutation generator 402 includes an omega network of a plurality of network switches 408, arranged to receive a corresponding each of a plurality of input bits 409 (e.g., Input Bits 0-7) and to output a plurality of output bits 410 (e.g., Output Bits 0-7). Note that for clarity, only one of the plurality of network switches 408 is labeled. In embodiments, permutation generator 402 is further coupled to a pseudorandom number generator (PRNG) 403 to receive a plurality of control bits 405. In embodiments, each of control bits 405 is a swap enable bit generated by PRNG 403 to control a corresponding network switch 408 of the omega network. In embodiments, the PRNG is seeded with an address 415 (also, "address seed" or "address-based seed") for one or more control bits 405. Note that as shown in FIGS. 3A and 3B, permutation generator 303 is located to operate on a codeword or portion of a codeword (e.g., input bits 409), e.g., the contents of a 32-bit bus, that carries the codeword from encoder 301a to the I/O logic 305a and from I/O logic 305b to decoder 301b. In embodiments, address 415 corresponds to a memory device address associated with a bus on which an input bit is transferred.

In some embodiments, the omega network performs a shuffle or a perfect shuffle of a plurality of input bits 409 to output a plurality of output bits 410. For example, a perfect shuffle includes the ability for any bit to travel from any input to any output. Note that in embodiments, an omega network with N inputs has N/2 2×2 switches to perform pairwise swaps between all N inputs in a first stage. In embodiments, the omega network has log 2N stages to perform enough pairwise swaps to enable any bit to travel from any input to any output of the omega network. As shown, in embodiments, permutation generator 402 includes an omega network of N=8 inputs and three stages, e.g., a first stage 408a, second stage 408b, and a third stage 408c.

Figure 5:
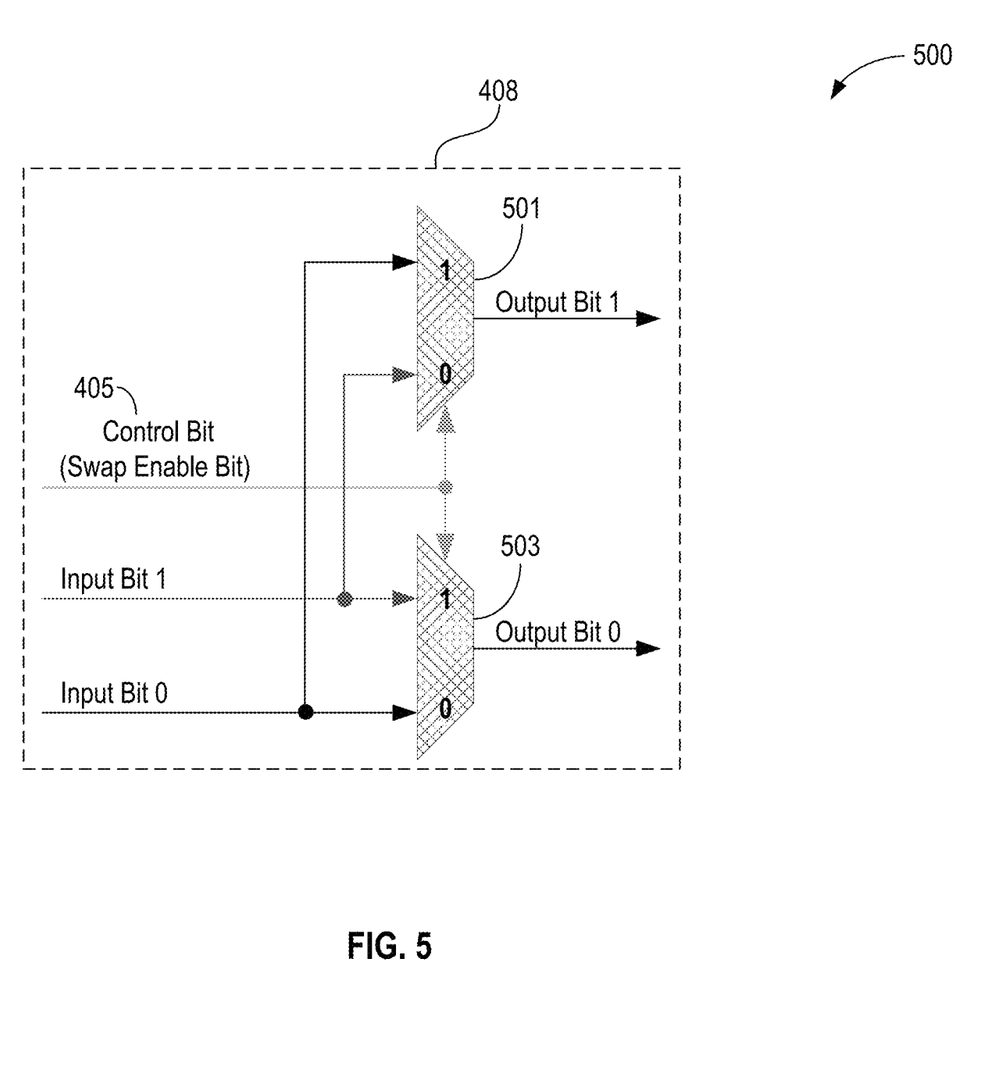
FIG. 5 illustrates a network switch described in connection with FIG. 4 in more detail, according to embodiments of the present disclosure.

FIG. 5 illustrates network switch 408 of FIG. 4 in more detail, according to embodiments. For example, in FIG. 5, network switch 408 can be implemented by a pair of multiplexers, e.g., respective multiplexers 501 and 503 that are controlled by a shared select bit that serves as control bit 405. In embodiments, network switch 408 is a 2×2 network switch that can perform a swap or direct copy of two input bits. In embodiments, for N inputs, the 2×2 network switches are controlled with a corresponding plurality of N/2*log 2N pseudorandom swap enable bits (e.g., control bits 405). As discussed previously, in embodiments, a memory device address is used as an address-based seed. For example, as shown in FIG. 4, PRNG 403 has different seeds for different addresses of the memory device, e.g., logical or physical addresses. In some embodiments, the address-based seed includes a physical or logical memory address associated or assigned to an incoming codeword at the beginning of processing of the codeword. Accordingly, in some embodiments, an address-based seed may be based on a physical NAND addresses of a NAND memory device. Note that, in embodiments, if N inputs correspond to e.g., 64 bit locations represented by a bus, 192 control bits (e.g., control bit(s) 405 of FIG. 4) for the codeword need to be generated (N/2*log 2N=64/2*log 264=32*6=192 pseudorandom bits for a codeword with 64 bits). Accordingly, in embodiments, if the bus transfers up to 32 bits per clock cycle, 96 pseudorandom bits per clock cycle are to be generated.

In embodiments, PRNG 403 includes any suitable PRNG that can generate and provide a seed to a permutation generator, e.g., permutation generator 402. Various embodiments include PRNG's based on algorithms, e.g., the Mersenne Twister, Xoshiro256, Xoshiro128, and the SplitMix64. For example, the SplitMix64 may initialize the Xoshiro128 PRNG state with two pseudorandom 64-bit numbers generated from a physical address at the beginning of processing a codeword. Then, in embodiments, three steps of the Xoshiro128 may be used to generate three 32-bit pseudorandom numbers to provide 96 pseudorandom bits per clock cycle. In embodiments, after generating the permuted locations, permutation generator 402 is to provide bits having a permuted location to an I/O logic (e.g., I/O logic 305 of FIG. 3A) of a memory device, e.g., memory device 306 of FIG. 3A. Other suitable PRNGs include but are not limited to, e.g., Xoroshiro128+, Random Cycle Bit Generator (RCB), Permuted Congruential Generator (PCG), Philox, Threefry, Advanced Ranomization System (ARS), Aa small noncryptographic PRNG (JSF), Well Equidistributed Long-Period Linear (WELL), Xorshift, Linear Feedback Shift register (LFSR), and the Park-Miller generator.

Figure 6:
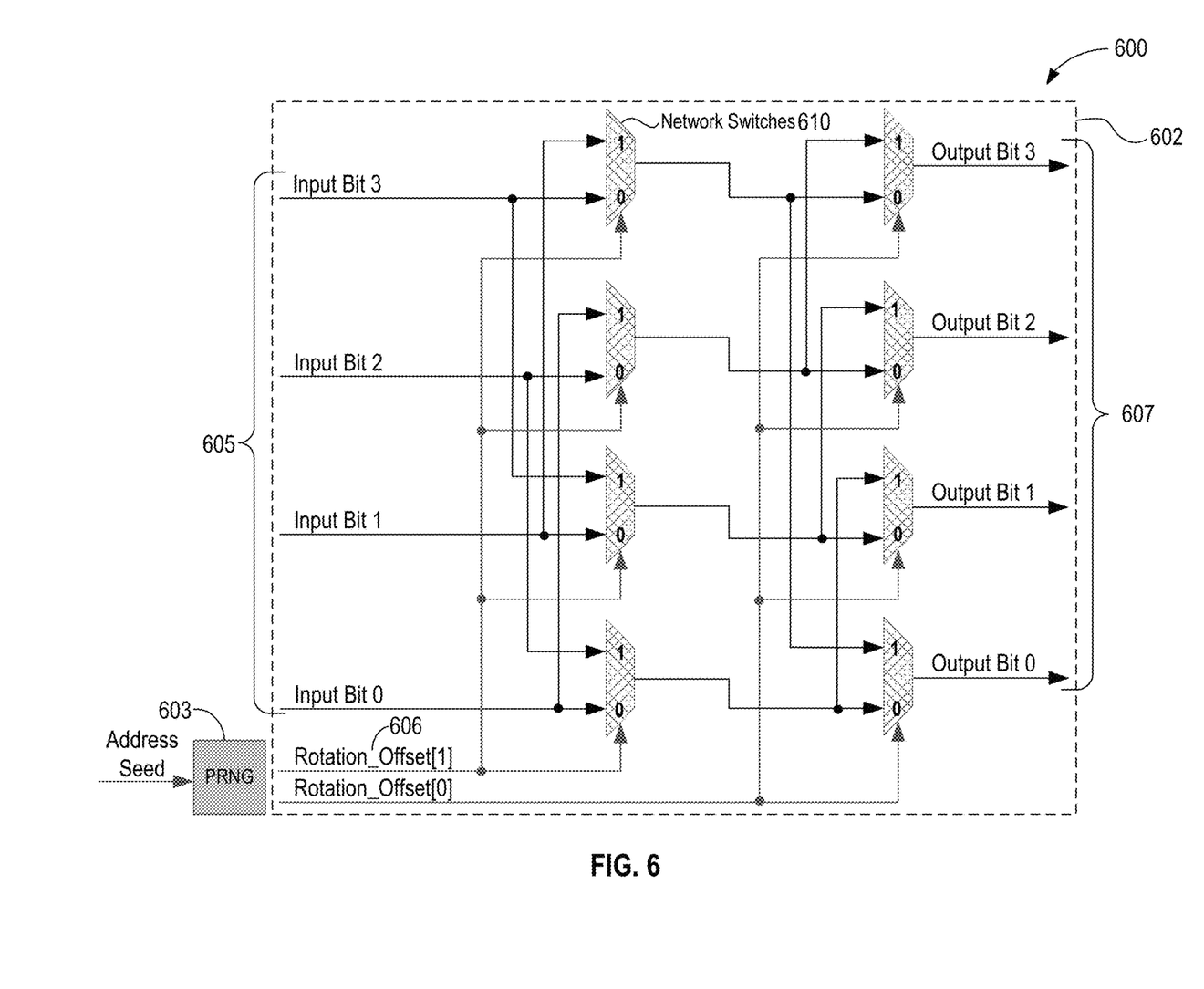
FIG. 6 illustrates another example permutation generator, according to embodiments of the present disclosure.

Note that in other embodiments, a rotational matrix or other suitable arrangement of network switches can serve as a permutation generator, e.g., permutation generator 402 of FIG. 4. In embodiments, one or more barrel shifter networks implement rotations of the bits according to a pseudorandom offset. Note that a rotation of bits can include a swapping or movement of three or more bits at a time. For example, FIG. 6 illustrates a permutation generator 602, e.g., barrel shifter network. In embodiments, the barrel shifter network includes a plurality of network switches 610 coupled to receive N=4 input bits (see, e.g., 605 in FIG. 6) and to provide 4 output bits (e.g., see 607). In embodiments, PRNG 603 is an address-seeded PRNG to generate a rotation offset bit 606, e.g., pseudorandom offset bit. In other embodiments, another seed may be used, including other information available at a read time and a write time. In embodiments, the barrel shifter network can implement rotations for an entire 64 bits at a time or only 32 bits at a time. In some embodiments, each 32-bit barrel shifter can rotate bits in parallel.

Figure 7:
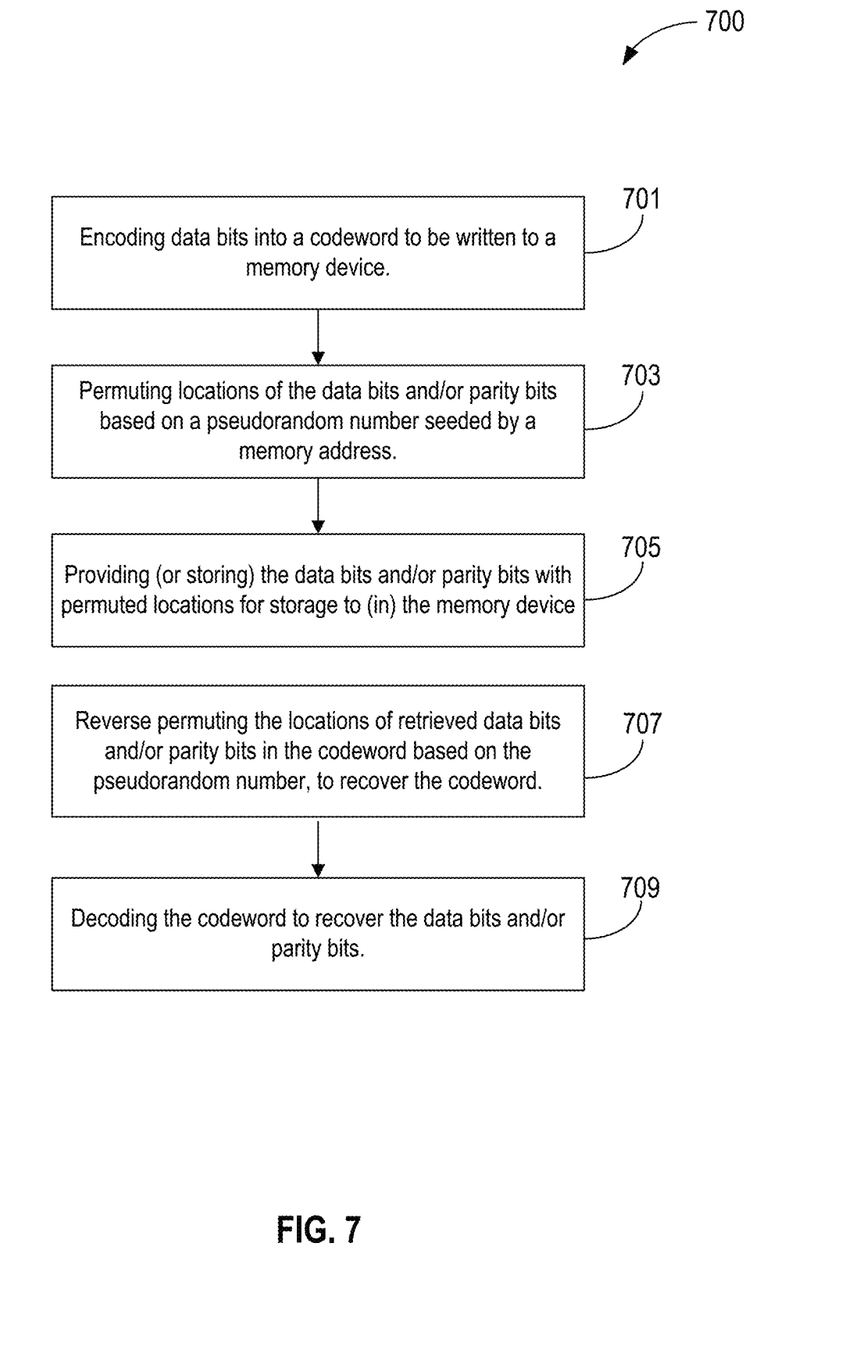
FIG. 7 is a flow diagram illustrating an example process that is performed in connection with FIGS. 3A/3B-6, in accordance with embodiments of the present disclosure.

FIG. 7 is a flow diagram illustrating an example process 700 that is performed by, e.g., a memory controller, constituent portions of memory controller, or in other embodiments, in logic in the memory device 306 of FIG. 3A or 3B itself, or other logic associated with the memory device, in accordance with embodiments of the present disclosure. To begin, at a block 701, process 700 includes encoding data bits into a codeword to be written to a memory device, e.g., memory device 306 of FIG. 3A or 3B. In embodiments, an error correction (ECC) engine including an LDPC encoder, e.g., encoder 301a of FIG. 3A or 3B, performs the encoding. At a next block 703, in embodiments, a permutation generator, e.g., permutation generator 402 or 602 of respective FIGS. 4 and 6, may permute locations of the bits based on a pseudorandom number generated by a PRNG, e.g., PRNG 403 of FIG. 4 or PRNG 603 of FIG. 6. In embodiments, the pseudorandom number is seeded by a memory address or other information that is available at a write operation time and a read operation time. In embodiments, the permutation generator is to randomize the bit locations by rotating bits or swapping bit locations without changing a value of the rotated or swapped bits. In embodiments, at a next block 705, process 700 incudes providing the bits with permuted locations for storage to the memory device. At block 707, as part of a read operation, process 700 includes receiving the codeword from the memory device and reverse permuting the locations of retrieved bits in the codeword (e.g., reverse permutation generator 303b of FIG. 3A or 3B based on the pseudorandom number, to recover the codeword. Finally, at a last block 709, process 709 includes decoding the codeword to recover the bits. In embodiments, where the ECC engine includes an LDPC encoder, the ECC further includes an LDPC decoder (e.g., decoder 301b) to decode the codeword. Note that in some embodiments, codeword 325 includes any suitable error correction information or ECC that is used to assist in correcting errors in memory devices. In other embodiments, the codeword may be a Bose-Chaudhuri-Hocquenghtem (BCH) codeword. Furthermore, note that in some embodiments, a memory device itself performs process 700, in particular, operations associated with blocks 703-709.

Figure 8:
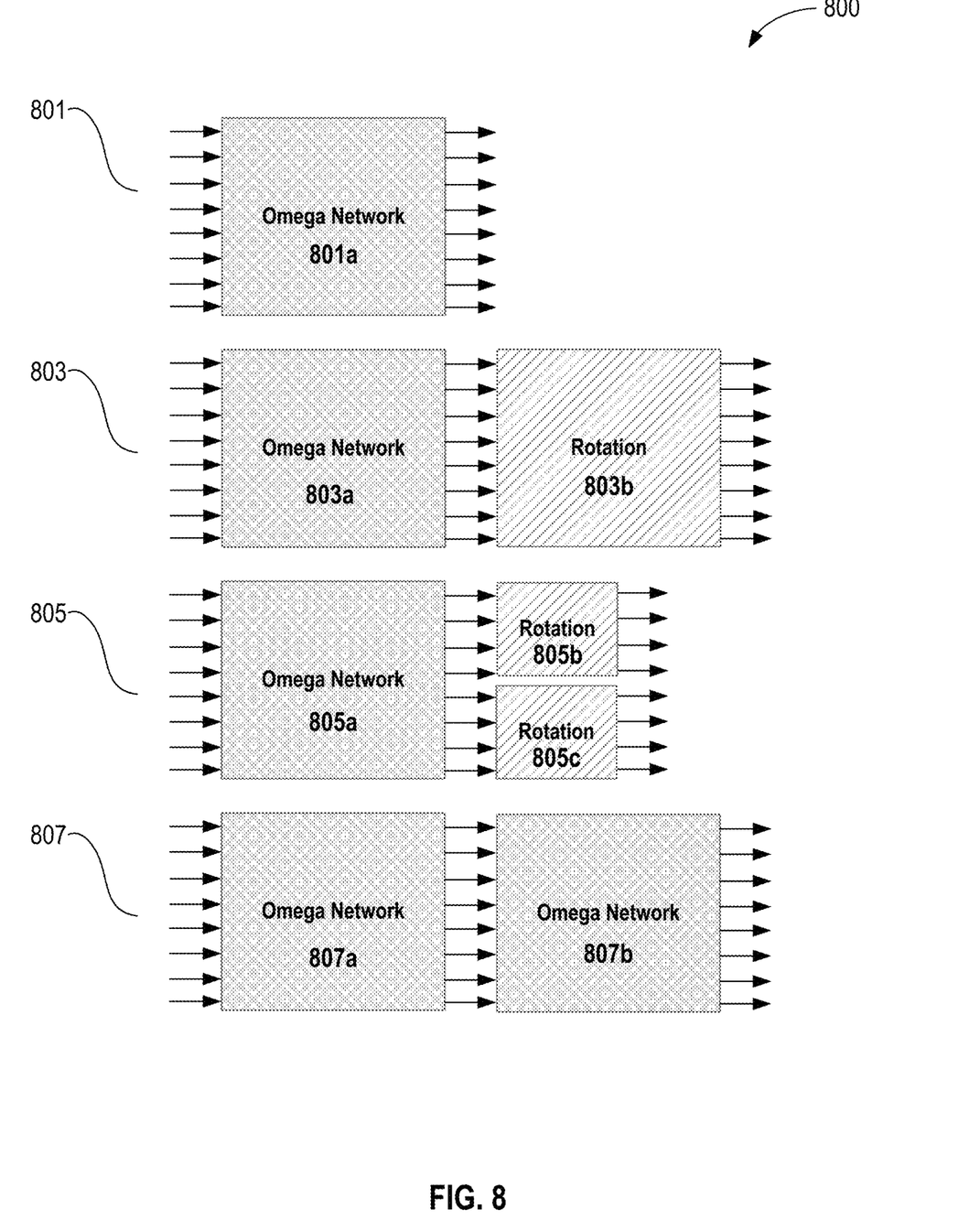
FIG. 8 is a block diagram of example arrangements associated with a permutation generator including one or more stages to perform a shuffling and/or rotation of bits, according to embodiments of the present disclosure.

FIG. 8 illustrates example arrangements 800 associated with a permutation generator including one or more stages to perform a shuffling and/or rotation of bits as described in connection with FIGS. 3-8. For example, FIG. 8 shows arrangements 801, 803, 805, and 807, where some arrangements include stages of an omega network or rotational matrix cascaded in series and/or parallel. In embodiments, a rotational matrix includes a plurality of network switches arranged to rotate bits, similar to, e.g., barrel shifter network 602 of FIG. 6. As shown, arrangement 801 includes a single omega network 801a, similar to the omega network of permutation generator 402 of FIG. 4. In embodiments, single omega network 801a performs a shuffle of a plurality of input bits, as described in connection with FIG. 4. In embodiments, a next example arrangement 803 includes an omega network 803a coupled to shuffle a plurality of input bits, and then subsequently provide output bits to a rotational matrix 803b for further permuting of the output bits. Next, another example embodiment of arrangement 805 includes omega network 805a coupled to provide output bits to rotational matrices 805b and 805c. In embodiments, rotational matrices 805b and 805c include a network arrangement of switches to perform permuting of output bits substantially in parallel. Arrangement 807 illustrates a first omega network 807a coupled in series to a second omega network 807b. In embodiments, first omega network 807a shuffles a plurality of output bits and is coupled to second omega network 807b, which may further shuffle the output bits. Although arrangements 801, 803, 805, and 807 illustrate one or two stages of omega network or rotational matrix in a cascaded or coupled arrangement, it is understood that any suitable number of stages can be included (in any suitable order) to provide sufficient shuffling and/or rotation of bits.

Figure 9:
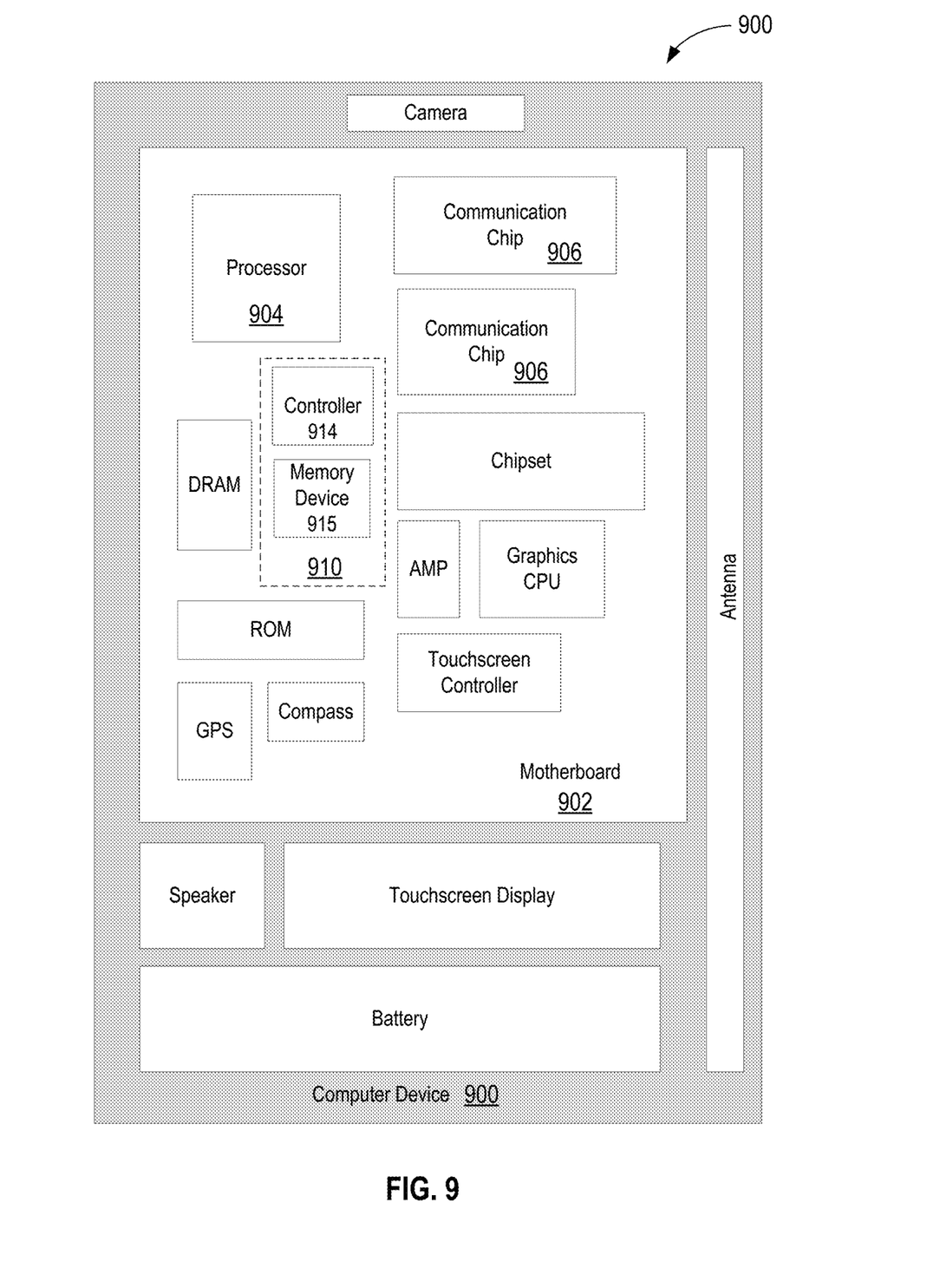
FIG. 9 illustrates an example computer system or computer device that may include components corresponding to and/or implementing various components and methods of FIGS. 3A/3B-8, according to embodiments of the present disclosure.

FIG. 9 illustrates an example computer system or computer device 900 that may include components corresponding to and/or implementing various components and methods of FIGS. 3-8. In embodiments, computer device 900 includes a permutation generator coupled to receive a codeword and to permute a location of one or more bits in the codeword based at least in part on a pseudorandom number, as described in connection with FIGS. 3-8. In embodiments, computer device 900 houses a board 902, such as, for example, a motherboard. The board 902 may include a number of components, including but not limited to a processor 904 and at least one communication chip 906. The processor 904 is physically and electrically coupled to the board 902. In some implementations, the at least one communication chip 906 is also physically and electrically coupled to the board 902. In further implementations, the communication chip 906 is part of the processor 904.

In embodiments, processor 904 is coupled to a memory device 915 including a plurality of locations corresponding to addresses to store one or more bits of a codeword. In embodiments, a permutation generator is to permute or change a location of the one or more bits in the codeword based at least in part on a pseudorandom number. Note that the permutation generator is similar to or the same as the permutation generator 303 of, e.g., FIG. 3A. In embodiments, the permutation generator is included in, e.g., a memory controller or controller 914 coupled to a memory device 915 and includes an error correction code (ECC) engine. In some embodiments, the permutation generator is included in memory device 915 itself (e.g., FIG. 3B). In embodiments, the ECC engine also includes an encoder to receive bits to be written to the plurality of addresses in memory device 915 and is operated to encode the bits into a codeword. In embodiments, the ECC engine also includes a decoder, to perform associated operations to recover the codeword as described in connection with, e.g., FIGS. 3A and/or 3B. In embodiments, the permutation generator, in embodiments, is to provide the bits to be written to memory device 915 in the permuted locations to reduce a recurrence of bit error patterns associated with the bits when stored in memory device 915.

In embodiments, controller 914 and memory device 915 may be included in a memory or storage drive or device such as, e.g., a solid-state drive (SSD) 910, in accordance with various embodiments of the present disclosure. In some embodiments, memory device 915 includes non-volatile memory, including e.g., NAND flash memory. In other embodiments, memory device 915 include 3D XPOINT™ memory devices. Note that in embodiments, memory device 915 includes any suitable persistent memory. In embodiments, memory device 915 includes any suitable memory that stores data by changing the electrical resistance of the memory cells. In embodiments, memory device 915 includes a byte-addressable write-in-place three dimensional cross-point memory device, or other byte addressable write-in-place non-volatile memory (NVM) device, such as single or multi-level Phase Change Memory (PCM) or phase change memory with a switch (PCMS), NVM devices that use chalcogenide phase change material (for example, chalcogenide glass), resistive memory including metal oxide base, oxygen vacancy base and Conductive Bridge Random Access Memory (CB-RAM), nanowire memory, ferroelectric random access memory (FeRAM, FRAM), magneto resistive random access memory (MRAM) that incorporates memristor technology, spin transfer torque (STT)-MRAM, a spintronic magnetic junction memory based device, a magnetic tunneling junction (MTJ) based device, a DW (Domain Wall) and SOT (Spin Orbit Transfer) based device, a thyristor based memory device, or a combination of any of the above, or other memory.

Depending on its applications, computer device 900 may include other components that may or may not be physically and electrically coupled to the board 902. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 906 may enable wireless communications for the transfer of data to and from the computer device 900. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 906 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computer device 900 may include a plurality of communication chips 906. For instance, a first communication chip 906 may be dedicated to shorter range wireless communications such as Wi-Fi and Bluetooth and a second communication chip 906 may be dedicated to longer range wireless communications such as GPS, EDGE, GPRS, CDMA, WiMAX, LTE, Ev-DO, and others.

The processor 904 of the computer device 900 includes an integrated circuit die packaged within the processor 904. In some implementations of the invention, the integrated circuit die of the processor includes one or more devices, such as MOS-FET transistors built in accordance with implementations of the invention. The term "processor" may refer to any device or portion of a device that processes electronic data from registers and/or memory to transform that electronic data into other electronic data that may be stored in registers and/or memory.

The communication chip 906 also includes an integrated circuit die, e.g., die described in connection with the above embodiments, packaged within the communication chip 906. In accordance with another implementation of the invention, the integrated circuit die of the communication chip includes one or more devices, such as MOS-FET transistors built in accordance with implementations of the invention.

In further implementations, another component housed within the computer device 900 may contain an integrated circuit die that includes one or more devices, such as MOS-FET transistors built in accordance with implementations of the invention.

In various implementations, the computer device 900 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computer device 900 may be any other electronic device that processes data.

Each of these elements may perform its conventional functions known in the art in addition to the functions associated with embodiments described according to the present disclosure.

The flowchart and block diagrams in the figures illustrate the architecture, functionality, and operation of possible implementations of systems, methods and computer products or computer program products according to various embodiments of the present disclosure. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

According to various embodiments, the present disclosure describes a number of examples.

Example 1 includes an apparatus, comprising: an interface to receive bits from an error correction code (ECC) engine, wherein the bits are to be written to a memory device and wherein the ECC engine to include an encoder to receive and to encode the bits into a codeword; and a permutation generator including the interface and coupled to the ECC engine to receive the codeword and to permute a location of one or more bits in the codeword based at least in part on a pseudorandom number and to provide the bits to be written to the memory device based on the permuted locations to reduce a recurrence of bit error patterns associated with the bits when stored in the memory device.

Example 2 includes the apparatus of Example 1, wherein the permutation generator comprises a forward permutation generator and further comprises a reverse permutation generator to, in response to a read request of the data, reverse permute locations of the bits to recover the codeword based on the pseudorandom number.

Example 3 includes the apparatus of Example 2, wherein the pseudorandom number is based at least in part on an address in the memory device and the apparatus further comprises a pseudorandom number generator (PRNG), seeded with the address, and coupled to the permutation generator to generate the pseudorandom number.

Example 4 includes the apparatus of Example 1, wherein the permutation generator includes a networked plurality of switches and wherein the permutation generator is to provide the bits having the permuted location to an I/O logic of the memory device Example 5 includes the apparatus of Example 1, wherein the apparatus includes a memory controller and the permutation generator comprises at least one of an omega network and a barrel shifter.

Example 6 includes the apparatus of Example 4, wherein the apparatus includes the memory device.

Example 7 includes the apparatus of Example 2, wherein the encoder comprises an LDPC encoder and the ECC engine further comprises an LDPC decoder to decode the codeword to recover the bits.

Example 8 includes the apparatus of any one of Examples 1-7, wherein the permutation generator is to randomize locations of the bits by rotating bits or swapping bit locations without changing a value of the rotated or swapped bits.

Example 9 includes a method, comprising, encoding, by an error correction code (ECC) engine, bits into a codeword to be written to a memory device; receiving, by a permutation generator, the codeword from the ECC engine; and permuting locations of bits based at least in part on a pseudorandom number to reduce a recurrence of bit error patterns associated with the bits to be stored in the memory device.

Example 10 includes the method of Example 9, wherein the pseudorandom number is generated by a pseudorandom number generator (PRNG) seeded with one or more addresses of the memory device.

Example 11 includes the method of Example 9, further comprising, as part of a read operation, receiving the codeword from the memory device and reverse permuting the locations of the bits in the codeword based on the pseudorandom number, to recover the codeword.

Example 12 includes the method of Example 9, further comprising generating by a PRNG, a control bit, and providing the control bit to the permutation generator to control a switch included in a plurality of network switches.

Example 13 includes the method of Example 9 wherein the control bit comprises a pseudorandom swap enable bit or a pseudorandom offset bit.

Example 14 includes a system, comprising: a processor; a memory device coupled to the processor, wherein the memory device is to store a codeword; an error correction code (ECC) engine including an encoder to receive bits to be written to the memory device and operated by the processor to encode the bits into the codeword; and a permutation generator coupled to the ECC engine to receive the codeword and to permute a location of one or more bits in the codeword based at least in part on a pseudorandom number and to provide the bits to be written to the memory device based on the permuted locations to reduce a recurrence of bit error patterns associated with the bits when stored in the memory device.

Example 15 includes the system of Example 14, wherein the ECC engine and the permutation generator are included in a memory controller and the bits having a permuted location are provided by the permutation generator to an input/output (I/O) logic to be written to the memory device.

Example 16 includes the system of Example 14, wherein the permutation generator comprises a network of a plurality of switches to generate a pseudorandom number based at least in part on an address of the memory device Example 17 includes the system of Example 16, wherein the permutation generator comprises an omega network or a barrel shifter network.

Example 18 includes the system of Example 14, wherein the memory device comprises 3D NAND memory device or a phase change memory device.

Example 19 includes the system of Example 14, wherein the ECC engine comprises a low-density parity-check (LDPC) encoder and decoder.

Example 20 includes the system of Example 14, wherein the memory device comprises a solid-state memory drive (SSD) and the permutation generator is included in the SSD.

Example 21 includes the system of Example 14, wherein the ECC engine and the permutation generator are included in a memory controller coupled to the memory device.

Example 22 is an apparatus comprising means for performing the method of any one of Examples 9-13 or some other example herein.

Various embodiments may include any suitable combination of the above-described embodiments including alternative (or) embodiments of embodiments that are described in conjunctive form (and) above (e.g., the "and" may be "and/or"). Furthermore, some embodiments may include one or more articles of manufacture (e.g., non-transitory computer-readable media) having instructions, stored thereon, that when executed result in actions of any of the above-described embodiments. Moreover, some embodiments may include apparatuses or systems having any suitable means for carrying out the various operations of the above-described embodiments.

The above description of illustrated implementations, including what is described in the Abstract, is not intended to be exhaustive or to limit the embodiments of the present disclosure to the precise forms disclosed. While specific implementations and examples are described herein for illustrative purposes, various equivalent modifications are possible within the scope of the present disclosure, as those skilled in the relevant art will recognize.

These modifications may be made to embodiments of the present disclosure in light of the above detailed description. The terms used in the following claims should not be construed to limit various embodiments of the present disclosure to specific implementations disclosed in the specification and the claims. Rather, the scope is to be determined entirely by the following claims, which are to be construed in accordance with established doctrines of claim interpretation.

What is claimed is:
1. An apparatus, comprising:
an interface to receive bits from an error correction code (ECC) engine, wherein the bits are to be written to a memory device and wherein the ECC engine is to include an encoder to receive and to encode the bits into a codeword; and a permutation generator including the interface and coupled to the ECC engine to receive the codeword and to change a location of one or more bits in the codeword based at least in part on a pseudorandom number and to provide the bits to be written to the memory device based on the changed locations to assist in reduction of a recurrence of bit error patterns associated with the bits when stored in the memory device, wherein the permutation generator is an omega network and a pseudorandom number generator (PRNG) is to provide to the omega network a plurality of swap enable bits to control a corresponding plurality of networked switches of the omega network.

2. The apparatus of claim 1, wherein to change the location of one or more bits includes to permute a location of one or more bits in the codeword and the permutation generator comprises a forward permutation generator and the apparatus further comprises a reverse permutation generator to, in response to a read request of the data, reverse permute or reverse changes in locations of the bits to recover the codeword based on the pseudorandom number.

3. The apparatus of claim 2, wherein the pseudorandom number is based at least in part on an address in the memory device and the apparatus further comprises the PRNG, seeded with the address, and coupled to the permutation generator to generate the pseudorandom number.

4. The apparatus of claim 3, wherein the apparatus includes a memory controller and the permutation generator further comprises a barrel shifter.

5. The apparatus of claim 1, wherein the apparatus includes the memory device.

6. The apparatus of claim 1, wherein the permutation generator is to randomize locations of the one or more bits in the codeword by rotating bite locations or swapping bit locations without changing a value of the bits moved to the rotated or swapped locations to transform the codeword into a permuted codeword.

7. The apparatus of claim 1, wherein the permutation generator is to provide bits having permuted or changed locations to an I/O logic of the memory device.

8. A method, comprising,
encoding, by an error correction code (ECC) engine, bits into a codeword to be written to a memory device;
receiving, by a permutation generator, the codeword from the ECC engine; and
changing, by the permutation generator, locations of bits based at least in part on a pseudorandom number to assist in reduction of a recurrence of bit error patterns associated with the bits to be stored in the memory device; and
storing the bits in the memory device, wherein the permutation generator includes an omega network and the omega network is to receive from a pseudorandom number generator (PRNG), a plurality of swap enable bits to control a corresponding plurality of networked switches of the omega network.

9. The method of claim 8, wherein changing locations of bits comprises permuting locations of the bits and wherein the pseudorandom number is generated by the PRNG seeded with one or more addresses of the memory device.

10. The method of claim 8, further comprising, as part of a read operation, receiving a permuted codeword from the memory device and reversing a change or permutation in the locations of the bits in the codeword based on the pseudorandom number, to recover the codeword.

11. The method of claim 8, further comprising generating by the PRNG a control bit, and providing the control bit to the permutation generator to control a switch included in the plurality of network switches.

12. The method of claim 8 wherein the control bit comprises a pseudorandom swap enable bit or a pseudorandom offset bit.

13. A system, comprising:
a processor;
a memory device coupled to the processor;
an error correction code (ECC) engine including an encoder to receive bits to be written to the memory device and operated by the processor to encode the bits into a codeword; and
a permutation generator coupled to the ECC engine to receive the codeword and to change a location of one or more bits in the codeword based at least in part on a pseudorandom number and to provide the bits to be written to the memory device based on the changed locations to assist in reduction of a recurrence of bit error patterns associated with the bits when stored in the memory device, wherein the permutation generator is an omega network and a pseudorandom number generator (PRNG) is to provide to the omega network a plurality of swap enable bits to control a corresponding plurality of networked switches of the omega network.

14. The system of claim 13, wherein the ECC engine and the permutation generator are included in a memory controller and the bits having a permuted location are provided by the permutation generator to an input/output (I/O) logic to be written to the memory device.

15. The system of claim 13, wherein the permutation generator to change the location of one or more bits includes to permute a location of one or more bits in the codeword and wherein the permutation generator is to generate a pseudorandom number based at least in part on an address of the memory device.

16. The system of claim 15, wherein the permutation generator further comprises a barrel shifter network.

17. The system of claim 13, wherein the memory device comprises 3D NAND memory device or a phase change memory device.

18. The system of claim 13, wherein the ECC engine comprises a low-density parity-check (LDPC) encoder and decoder.

19. The system of claim 18, wherein the memory device includes a solid-state memory drive (SSD) and the permutation generator is included in the SSD.

* * * * *